United States Patent [19]
Ohtsuka

[11] Patent Number: 5,289,053
[45] Date of Patent: Feb. 22, 1994

[54] NONVOLATILE SEMICONDUCTOR MEMORY DEVICE
[75] Inventor: Nobuaki Ohtsuka, Yokohama, Japan
[73] Assignee: Kabushiki Kaisha Toshiba, Tokyo, Japan
[21] Appl. No.: 763,529
[22] Filed: Sep. 23, 1991
[30] Foreign Application Priority Data
Sep. 26, 1990 [JP] Japan ................. 2-257903
[51] Int. Cl.$^5$ ................................................ H03K 3/01
[52] U.S. Cl. ............................ 307/296.1; 307/296.5; 307/491; 365/189.01
[58] Field of Search ............. 365/189.01, 189.09; 307/469, 296.5, 264, 491, 296.8, 296.1

[56] References Cited
U.S. PATENT DOCUMENTS

| | | | |
|---|---|---|---|
| 4,380,709 | 4/1983 | Au ............................. | 307/473 |
| 4,682,052 | 7/1987 | Kyomasu ................. | 307/473 X |
| 4,689,504 | 8/1987 | Raghunathan et al. . | |
| 4,697,101 | 9/1987 | Iwahashi et al. ........ | 307/469 X |
| 4,779,015 | 10/1988 | Erdelyi .................... | 307/475 |
| 4,952,818 | 8/1990 | Erdelyi et al. .......... | 307/448 |
| 4,958,089 | 9/1990 | Fitzpatrick et al. .... | 307/448 |

FOREIGN PATENT DOCUMENTS
9002405 3/1990 PCT Int'l Appl. .
2201059 8/1988 United Kingdom .

Primary Examiner—Eugene R. LaRoche
Assistant Examiner—Son Dinh
Attorney, Agent, or Firm—Banner, Birch, McKie & Beckett

[57] ABSTRACT

The stress applied to a gate insulation film can be reduced by raising the potentials of the source and drain terminals of input gate transistors whose gate are applied with a high potential to a Vcc level or the like, when a programming high potential ($V_{PP}$) or a high potential for tri-state control is applied to an external input terminal of an input-stage circuit of an EPROM. Therefore, occurrence of problems of the reliability such as TDDB can be prevented and thus a highly reliable nonvolatile semiconductor memory device can be provided. Further, the elements can be miniaturized to increase the capacity of the nonvolatile semiconductor memory device, without scaling the conventional programming high potential and the high potential for tri-state control.

12 Claims, 2 Drawing Sheets

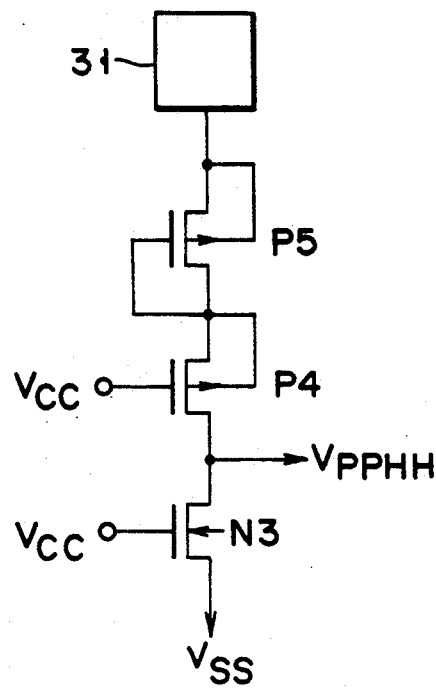
F I G. 3
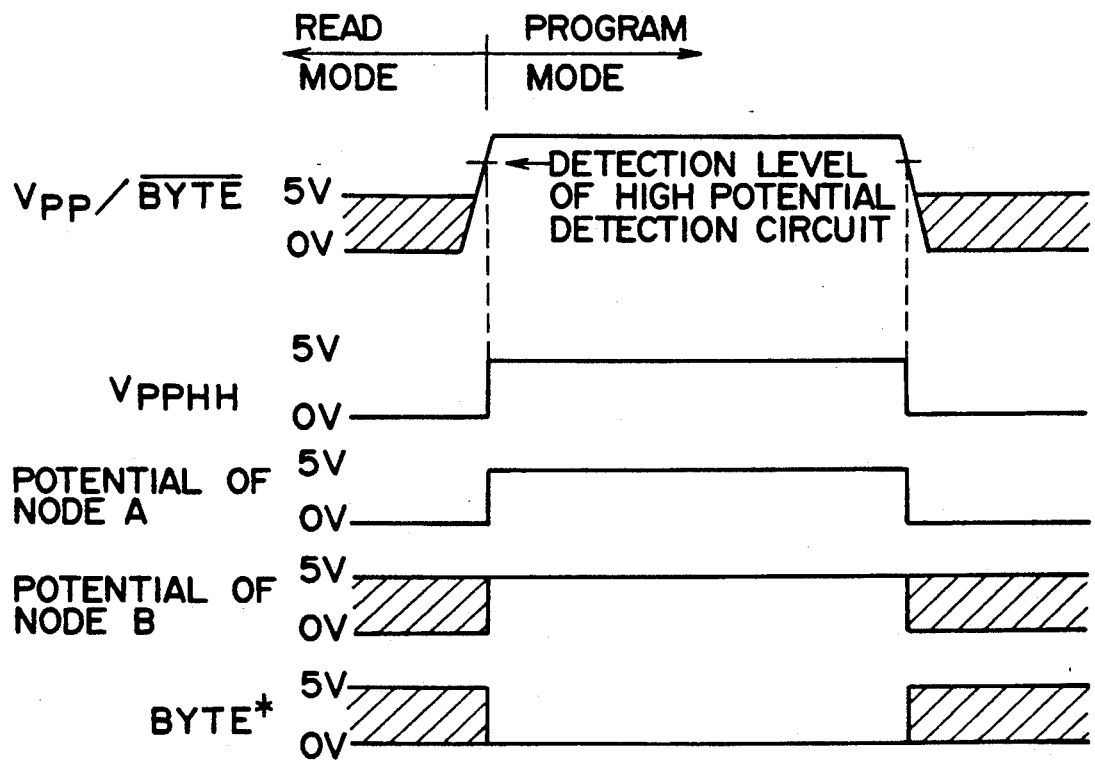
F I G. 4

NONVOLATILE SEMICONDUCTOR MEMORY DEVICE

BACKGROUND OF THE INVENTION

1. Field of the Invention

The present invention relates to a semiconductor memory device and, more particularly, to a nonvolatile semiconductor memory device using a high potential input.

2. Description of the Related Art

A conventional nonvolatile semiconductor memory device such as an EPROM (ultraviolet erasable programmable read only memory) or EEPROM (electrically erasable programmable read only memory) has a power source terminal ($V_{PP}$ power source terminal) for receiving a high potential $V_{PP}$ for programming. The $V_{PP}$ power source terminal is also used to receive another signal input.

When data is programmed into an EPROM, an internal high potential detection circuit is set into operative state by applying a high potential signal for tri-state control to a part of address terminals, for example, an input terminal for an address signal A9, so that a code called an electric signature indicating the name of the maker and the name of the device is read from the EPROM. An EPROM writer reads the signature code from the EPROM and automatically specifies the EPROM, and automatically sets the condition of writing data into the device without fail. As the potentials of tri-state control, a logical low level, a logical high level and a high potential $V_H$ sufficiently higher than the logical high level ar generally used.

FIG. 1 shows an example of an input-first stage circuit connected to a $V_{PP}$ power source terminal 31 in the conventional EPROM. In the above input-first stage circuit, a 2-input NOR circuit 32 of CMOS (complementary insulated gate) structure is constructed by P-channel MOS (insulated gate) transistors P1 and P2 and N-channel MOS transistors N1 and N2. Two-stage amplifying inverters 33 and 34 are connected to the output stage of the NOR circuit 32. A multiplexed signal of the $V_{PP}$ voltage and control signal $\overline{\text{BYTE}}$ is input through the $V_{PP}$ power source terminal 31 as one input of the NOR circuit 32 and a chip enable control signal $\overline{\text{CE}}^*$ is input as the other input of the same. The $V_{PP}$ power source terminal 31 is supplied with a control signal $\overline{\text{BYTE}}$ of "L" level (Vss potential, for example, 0 V) or "H" level (Vcc potential, for example, 5 V) in the read mode and supplied with a $V_{PP}$ voltage in the program mode. The control signal $\overline{\text{BYTE}}$ selectively sets the 8-bit read operation or 16-bit read operation.

In the mode in which a programming high potential $V_{PP}$ is not input to the $V_{PP}$ power source terminal 31, such as the read mode of the EPROM of the circuit shown in FIG. 1, when the control signal $\overline{\text{BYTE}}$ or chip enable control signal $\overline{\text{CE}}^*$ is set at the "H" level, the N-channel transistor N1 or N2 is turned on and the P-channel transistor P1 or P2 is turned off so that the output of the NOR circuit 32 will be set at the "L" level. On the other hand, when the control signal $\overline{\text{BYTE}}$ and the chip enable control signal $\overline{\text{CE}}^*$ are both set at the "L" level, the P-channel transistors P1 and P2 are both turned on and the N-channel transistors N1 and N2 are both turned off so that the output of the NOR circuit 32 will be set at the "H" level.

In contrast, when a programming high potential $V_{PP}$ is input to the $V_{PP}$ power source terminal 31 in the program mode of the EPROM, the P-channel transistor P1 is turned off and the N-channel transistor N1 is turned on so that each of the drains of the P-channel transistor P1 and N-channel transistor N1, that is, an output node of the NOR circuit 32, will be set at the ground potential Vss. The operation in the program mode is effected irrespective of the "H" level/"L" level of the chip enable control signal $\overline{\text{CE}}^*$, and, at this time, the output of the NOR circuit 32 is set at the "L" level.

The "L" or "H" level output of the NOR circuit 32 in the read mode and the "L" level output of the NOR circuit 32 in the program mode are supplied as an internal signal BYTE* to an internal circuit through the two-stage amplifying inverters 33 and 34.

Since each of the drains of the P-channel transistor P1 and N-channel transistor N1 of the NOR circuit 32 is set at the ground potential Vss in the program mode and the high potential $V_{PP}$ is applied to each gate, an electric field stress (referred to as "stress" hereinafter) of high potential $V_{PP}$ is applied to each gate insulation film.

Likewise, the stress of high potential is applied to the gate insulation film of a MOS transistor to which the high potential $V_H$ of tri-state control is input in to an input-first stage circuit which is connected to a terminal for reading electric signature of the EPROM, although not shown in the drawing. The programming high potential $V_{PP}$ and high potential $V_H$ for tri-state control are set at 12.5 V and 12 V in the EPROMs of 1 megabits and 4 megabits, respectively.

As the elements are more miniaturized with an increase in the capacity (16 megabits, for example) of the EPROM, the thickness of the gate insulation film is subjected to the scaling and the withstanding voltage of the insulation film is lowered. In order to cope with this problem, the stress applied to the internal circuit is reduced by lowering the power source input from the exterior in the chip, without changing the external power source level. However, even when the capacity of the EPROM is increased, it is undesirable for the user that the values of the high potentials $V_{PP}$ and $V_H$ are subject to the scaling if the compatibilities of the devices are taken into consideration. Particularly, when the high potential $V_H$ for reading the electric signature of the EPROM is different every device, it becomes impossible to automatically specify the EPROM by means of the EPROM writer. Thus, the high potential $V_H$ for reading the signature cannot be changed. Since the high potentials $V_{PP}$ and $V_H$ are directly applied from the exterior device to the gates of the transistors of the input-first stage circuit which is connected to the $V_{PP}$ power source terminal and the address terminal for reading the signature, serious problems such as TDDB (time dependent dielectric breakdown) may occur in reliability.

The same problem as that described above may occur in an input-first stage circuit connected to a test mode terminal in a case where the circuit operates the internal test circuit to effect the reliability test etc, of the internal circuit in the test mode, by applying a high potential of tri-state control to a part of the address terminals of the EPROM or a part of the control signal input terminals to operate the internal high potential detection circuit.

SUMMARY OF THE INVENTION

The present invention has been made to overcome the above problems, and an object of the present invention is to provide a highly reliable nonvolatile semiconductor memory device in which, even when a high potential is directly applied to the gate of the transistor from the exterior, the stress applied to the gate insulation film of a MOS transistor of an input-first stage circuit connected to an external terminal, to which a programming high potential or high potential of tri-state control is applied, can be reduced to thus prevent occurrence of problems of the reliability such as TDDB.

A nonvolatile semiconductor memory device of the present invention having an input-first stage circuit is characterized by comprising means for setting a ground terminal of an input gate circuit of the input-first stage circuit into an electrically floating state when an external input of high potential is applied to an external terminal.

A nonvolatile semiconductor memory device of the present invention having an input-first stage circuit which includes a MOS transistor whose gate is connected to an external terminal applied with a high potential for programming or tri-state control is characterized by comprising means, connected to the external terminal, for detecting that the external input is the high potential; and means for setting the potentials of the drain and source terminals of the MOS transistor of the input-first stage circuit to a value between the ground level and the high potential level of the external input according to a detection output signal of the detecting means.

Even when a high potential is directly applied to the gate of the MOS transistor of the input-first stage circuit from the exterior, a potential applied to the reference terminal of the input-first stage circuit is set at a value between the ground level and the high potential level of the external input according to a detection output signal of the high potential detection circuit. Therefore, the stress applied to the gate insulation film of the transistor is reduced so that occurrence of problems of the reliability such as TDDB can be prevented, thereby making it possible to provide a highly reliable nonvolatile semiconductor memory device. As a result, the elements can be miniaturized to increase the capacity of the nonvolatile semiconductor memory device without scaling the conventional programming high potential and the high potential for tri-state control.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 3 is a circuit diagram showing an example of the construction of a high potential detection circuit 11 shown in FIG. 2; and FIG. 4 is a diagram for illustrating the operation of the EPROM shown in FIG. 2.

DETAILED DESCRIPTION OF THE PREFERRED EMBODIMENT

There will now be described in detail an embodiment of a nonvolatile semiconductor memory device according to the present invention with reference to the accompanying drawings.

Figure 1:
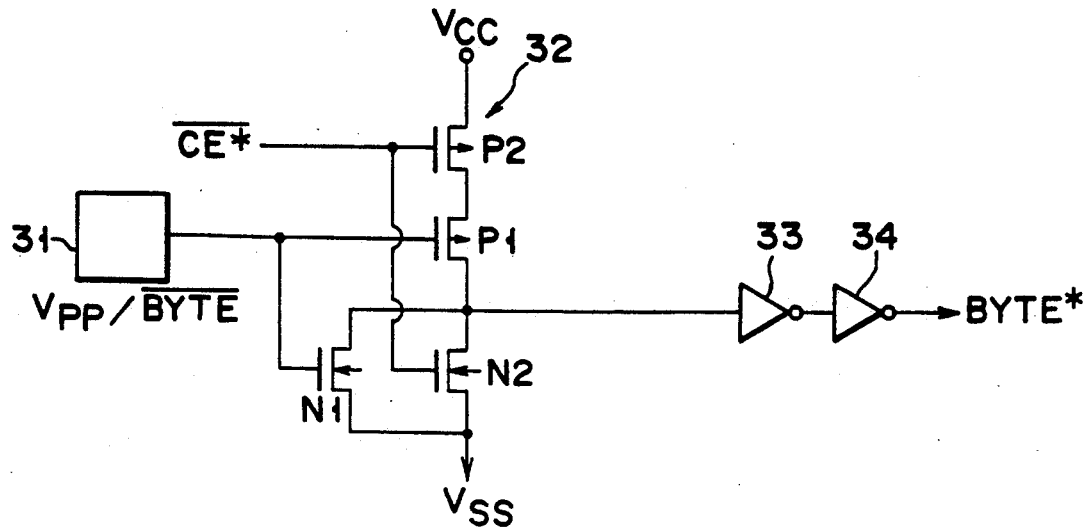
FIG. 1 is a circuit diagram showing a part of the conventional EPROM.
Figure 2:
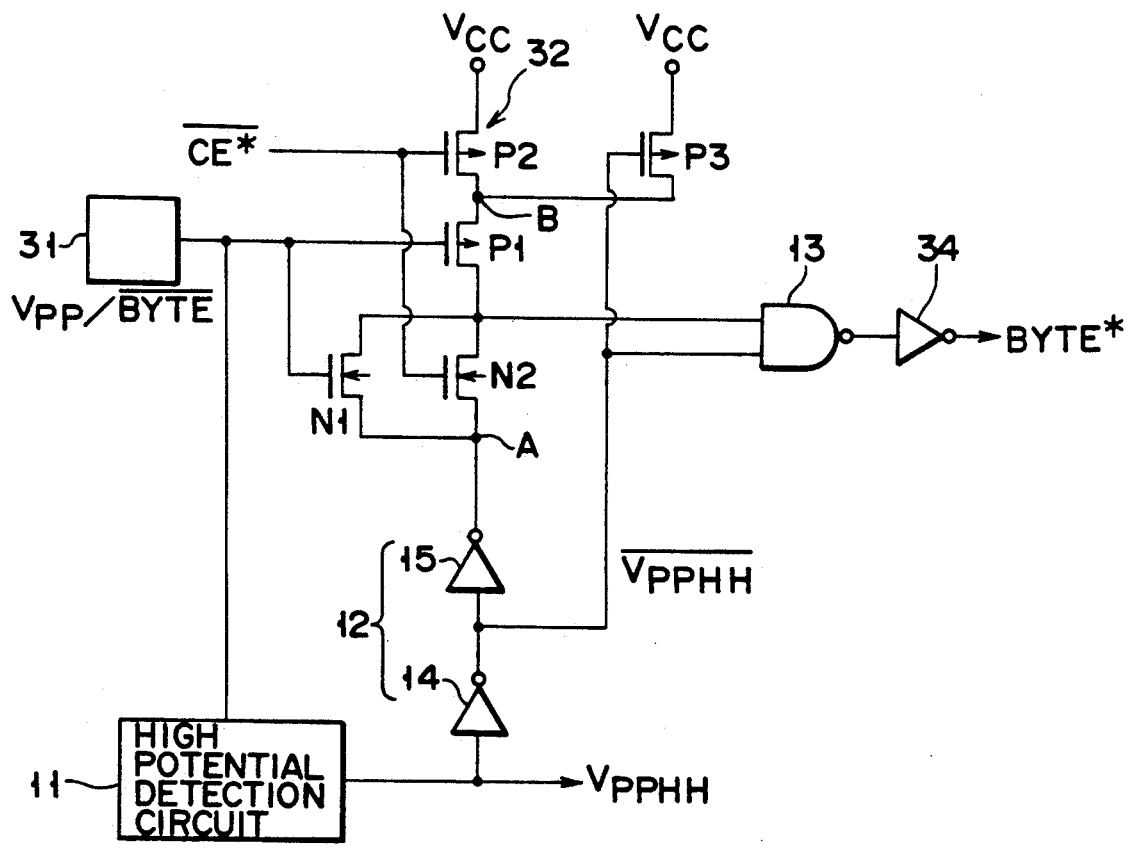
FIG. 2 is a circuit diagram showing a part of an EPROM according to an embodiment of a nonvolatile semiconductor memory device of the present invention.

FIG. 2 is a circuit diagram showing the construction of an input-first stage circuit of an EPROM which is a nonvolatile semiconductor memory device of the present invention. This embodiment is similar to the input-first stage circuit of the conventional EPROM shown in FIG. 1 except that a high potential detection circuit 11, node potential control circuit 12 and BYTE* signal polarity control circuit 13 are further provided. The high potential detection circuit 11 is constructed to detect whether an input signal of the $V_{PP}$ power source terminal 31 is a high potential signal $V_{PP}$, and the construction thereof is shown in FIG. 3. The node potential control circuit 12 is constructed by two-stage inverters 14 and 15 of CMOS structure, and a P-channel MOS transistor P3. The inverters 14 and 15 are cascade-connected between the detection output terminal of the high potential detection circuit 11 and a node A of the input-first stage circuit. The P-channel MOS transistor P3 is connected in parallel with a P-channel transistor P2 of the NOR circuit 32 between a node B and the Vcc power source, and has a gate applied with an output of the inverter 14. The control circuit 12 controls potentials of the nodes A and B in response to the detection output signal of the high potential detection circuit 11. The BYTE* signal polarity control circuit 13 is constructed by a 2-input NAND circuit of CMOS structure, input terminals of which are respectively connected to the output terminal of the inverter 14 and the output node of the NOR circuit 32. The control circuit 13 is used instead of the inverter 33 shown in FIG. 1. The potential of the node A, i.e. the source potential of the N-channel transistors N1 and N2, is controlled by the node potential control circuit 12 to be set at a value between the ground level Vss and the high potential level of an external input which is applied to the external input terminal 31. However, in this embodiment, in order to reduce the number of types of the power source potentials, the potential of the node A is controlled to either the ground potential Vss or the power source potential Vcc according to the condition. The potential of the node B is described later.

FIG. 3 is a circuit diagram showing the construction of the high potential detection circuit 11 of FIG. 2. The high potential detection circuit 11 is constructed by P-channel MOS transistors P5 and P4 and an N-channel MOS transistor N3 which are serially connected between the external input terminal, i.e. $V_{PP}$ power source terminal 31 and the ground terminal Vss. The source and substrate of the P-channel transistor P5 are connected together and the gate and drain thereof are also connected together. The gates of the P-channel transistor P4 and the N-channel transistor N3 are supplied with the power source potential Vcc. A detection output $V_{PPHH}$ is output from a node connected to drains of the P-channel transistor P4 and the N-channel transistor N3.

The operation of the nonvolatile semiconductor memory device of the present invention is explained with reference to FIGS. 2 to 4. First, the operation of the high potential detection circuit 11 is explained with reference to FIGS. 3 and 4. If the potential level of the $V_{PP}$ power source terminal 31 is equal to or lower than the power source potential Vcc, then the P-channel transistors P5 and P4 are turned off and the N-channel transistor N3 is turned on. As a result, the detection output $V_{PPHH}$ is set at the "L" level. In contrast, if a high potential (for example, 9 V or more) which is higher than the power source potential Vcc input to the $V_{PP}$ power source terminal 31 and has exceeded the detection level of the high potential detection circuit 11, then the P-channel transistor P5 is turned on and the P-channel transistor P4 is also turned on so that the detection output $V_{PPHH}$ may be set at the "H" level.

Next, if the control signal $\overline{BYTE}$ of "L" or "H" level is input to the $V_{PP}$ power source terminal 31 in the read mode of the EPROM shown in FIG. 2, then the detection output $V_{PPHH}$ of the high potential detection circuit 11 is set at the "L" level, as described before, so that the "L" level output, i.e., Vss potential of the inverter 15 may be supplied to the node A of the input-first stage circuit. If the dimension of the N-channel transistor (not shown) of the inverter 15 is made sufficiently large, the sources of the N-channel transistors N1 and N2 of the NOR circuit 32 can be substantially regarded as being directly coupled to the Vss potential. At this time, the "H" level output of the inverter 14 is supplied to the gate of the P-channel transistor P3 to turn off the transistor P3. The NAND circuit 13 which has one input terminal supplied with the "H" level output of the inverter 14 effects the same operation as the inverter supplied with an output of the NOR circuit 32. That is, the operation of the circuit shown in FIG. 2 effected at this time is the same as the operation effected in the read mode of the conventional circuit explained with reference to FIG. 1.

In contrast, if a programming high potential $V_{PP}$ (12.5 V in this example) is input to the $V_{PP}$ power source terminal 31 in the program mode of the EPROM, then the detection output $V_{PPHH}$ of the high potential detection circuit 11 is set at the "H" level, as described before. Thus, the "H" level output, i.e., Vcc potential of the inverter 15 is supplied to the node A of the input-first stage circuit. Since the high potential $V_{PP}$ is applied to the gates of the P-channel transistor P1 and the N-channel transistor N1 of the NOR circuit 32, the P-channel transistor P1 is turned off and the N-channel transistor N1 is turned on. As a result, the potential of the drains of the P-channel transistor P1 and the N-channel transistor N1, i.e., the potential of the output node of the NOR circuit 32 is set at the "H" level (Vcc potential). Since the NAND circuit 13 is supplied with the "L" level output of the inverter 14 and the "H" level output of the output node of the NOR circuit 32 the output thereof is set at the "H" level. The output of the NAND circuit 13 is inverted by means of the inverter 34 and then the output signal BYTE* of the inverter 34 is set at the same "L" level as is obtained in the program mode in the conventional circuit. The operation in the program mode is effected irrespective of the "H" level/"L" level of the chip enable control signal $\overline{CE^*}$.

In the program mode described above, the high potential $V_{PP}$ is input to the gates of the P-channel transistor P1 and the N-channel transistor N1 of the NOR circuit 32. However, in this case, since the drain, source and channel regions of the N-channel transistor N1 which is set in the ON state are set at Vcc potential, the stress caused only by the potential of $V_{PP}$—Vcc (12.5 V—5 V=7.5 V in this example) is applied to the insulation film of the N-channel transistor N1. Further, at this time, the "L" level output of the inverter 14 is applied to the gate of the P-channel transistor P3 to turn on the transistor P3 and the source potential of the P-channel transistor P1 of the NOR circuit 32, i.e., the potential of the node B is set at the "H" level (Vcc potential). In addition, the P-channel transistor P1 is set in the OFF state, but the source and drain of the P-channel transistor P1 are set at Vcc potential and the well region formed below the gate is set at potential Vcc so that only the stress caused by the potential of $V_{pp}$—Vcc (12.5 V—5 V=7.5 V in this example) is applied to the gate insulation film thereof like the N-channel transistor N1.

In the above embodiment, the input-first stage circuit connected to the $V_{PP}$ power source terminal 31 is explained as an example. However, the present invention can also be applied to an input-first stage circuit which is connected to an external terminal (address terminal also used for reading the signature, part of the control signal input terminals, exclusive terminal which is not generally used in the operating condition or the like) applied with a high potential for tri-state control in the same manner as in the former embodiment. Further, in the above embodiment, the input-first stage circuit having the NOR circuit is explained, but the present invention can also be applied to an input-first stage circuit using a NAND circuit in the same manner as in the above embodiment.

Further, the present invention is not limited to the EPROM of the above embodiment, and can be applied to an integrated circuit having an EEPROM and nonvolatile semiconductor memory element.

As described above, according to the present invention, it is possible to provide a highly reliable nonvolatile semiconductor memory device in which, even when a high potential is directly applied to the gate of the transistor from the exterior, the stress applied to the gate insulation film of a MOS transistor of an input-first stage circuit connected to an external terminal, to which a programming high potential or a high potential for tri-state control is applied, can be reduced so as to prevent occurrence of problems of the reliability such as TDDB.

Therefore, the elements can be miniaturized to increase the capacity of the nonvolatile semiconductor memory device without scaling the conventional programming high potential and the high potential for tri-state control.

Additional advantages and modifications will readily occur to those skilled in the art. Therefore, the invention in its broader aspects is not limited to the specific details, representative devices, and shown and described herein. Accordingly, various modifications may be without departing from the spirit or scope of the general inventive concept as defined by the appended claims and their equivalents.

What is claimed is:

1. An input-first stage circuit for use in a semiconductor device, comprising:
   an input terminal for receiving an externally-applied input signal, the externally-applied input signal having at least a high potential and a low potential;

a MOS transistor having a source, a drain, and a gate coupled to said input terminal and insulated from a channel region between said source and drain by an insulating layer;

a high potential detecting circuit coupled to said input terminal; and a potential setting circuit for setting the source of said MOS transistor to an intermediate potential between the high potential and the low potential in response to a detection of a high potential of the externally-applied input signal by said high potential detecting circuit, whereby an electrical stress to said insulation layer of said MOS transistor substantially equals the difference between the high potential and the intermediate potential.

2. An input-first stage circuit according to claim 1, wherein the low potential and the intermediate potential are power potentials.

3. An input-first stage circuit for use in a semiconductor device, comprising:

an input terminal for receiving an externally-applied input signal, the externally-applied input signal having at least a high potential and a low potential;

an N-channel MOS transistor having a source, a drain, and a gate coupled to said input terminal and insulated from a channel region between said source and the drain by an insulating layer;

a P-channel MOS transistor having a source, a drain coupled to the drain of said N-channel MOS transistor, and a gate coupled to said input terminal and insulated from a channel region between the source and the drain by an insulating layer;

a high potential detecting circuit coupled to said input terminal; and a potential setting circuit for setting the source of said N-channel MOS transistor and the source of said P-channel MOS transistor to an intermediate potential between the high potential and the low potential in response to a detection of a high potential of the externally-applied input signal by said high potential detecting circuit, whereby an electrical stress to the insulation layers of said N-channel and P-channel MOS transistors substantially equals the difference between the high potentials and the intermediate potential.

4. An input-first stage circuit according to claim 3, wherein the low potential and the intermediate potential are power potentials.

5. An input-first stage circuit according to claim 3 further comprising:

a further N-channel MOS transistor having a source coupled to the source of said N-channel MOS transistor and to said potential setting circuit, a drain coupled to the drain of said N-channel MOS transistor and the drain of said P-channel MOS transistor, and a gate coupled to an internal signal source; and a further P-channel MOS transistor having a source coupled to a reference potential, a drain coupled to the source of said P-channel MOS transistor and to said potential setting circuit, and a gate coupled to the internal signal source.

6. An input-first stage circuit according to claim 5, wherein said potential setting circuit comprises:

a first inverter having an input terminal coupled to said high potential detecting circuit and an output terminal;

a second inverter having an input terminal coupled to the output terminal of said first inverter and having an output terminal coupled to the sources of said N-channel MOS transistor and said further N-channel MOS transistor; and a P-channel MOS transistor having a source applied to a reference potential, a drain coupled to the source of said P-channel MOS transistor and to the drain of said further P-channel MOS transistor, and a gate coupled to the output terminal of said first inverter.

7. An input-first stage circuit according to claim 6 further comprising a signal polarity control circuit having:

a first input terminal coupled to the drain of said P-channel MOS transistor, the drain of said N-channel MOS transistor, and the drain of said further N-channel MOS transistor;

a second input terminal coupled to the output terminal of said first inverter; and an output terminal.

8. An input-first stage circuit according to claim 7, wherein said high potential detecting circuit comprises:

a first P-channel MOS transistor having a source and a substrate coupled to said input terminal, and a drain and a gate coupled to said node;

a second P-channel MOS transistor having a source and a substrate coupled to the node, a drain coupled to the first inverter of said potential setting circuit, and a gate coupled to a first reference potential; and an N-channel MOS transistor having a drain coupled to the drain of said second P-channel MOS transistor and to the first inverter of said potential setting circuit, a gate coupled to a second reference potential, and a source coupled to a third reference potential.

9. An input-first stage circuit according to claim 8 wherein said signal polarity control circuit comprises:

a NAND gate having (i) a first input coupled to the drains of said P-channel MOS transistor, said N-channel MOS transistor, and said further N-channel MOS transistor, (ii) a second input coupled to the output terminal of the first inverter of said potential setting circuit, and (iii) an output terminal; and an inverter having an input terminal coupled to the output terminal of said NAND gate and an output terminal.

10. An input-first stage circuit according to claim 5, wherein said high potential detecting circuit comprises:

a first P-channel MOS transistor having a source and a substrate coupled to said input terminal, and a drain and a gate coupled to a node;

a second P-channel MOS transistor having a source and a substrate coupled to the node, a drain coupled to said potential setting circuit, and a gate coupled to a first reference potential; and an N-channel MOS transistor having a drain coupled to the drain of said second P-channel MOS transistor and to said potential setting circuit, a gate coupled to a second reference potential, and a source coupled to a third reference potential.

11. An input-first stage circuit according to claim 2, wherein the low potential is Vss and the intermediate potential is Vcc.

12. An input-first stage circuit according to claim 4, wherein the low potential is Vss and the intermediate potential is Vcc.

* * * * *